United States Patent
Bouldin et al.

(12)

(10) Patent No.: US 6,261,873 B1
(45) Date of Patent: Jul. 17, 2001

(54) PEDESTAL FUSE

(75) Inventors: Dennis P. Bouldin, Essex Junction; Timothy H. Daubenspeck, Colchester; William T. Motsiff, Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/303,355

(22) Filed: Apr. 29, 1999

(51) Int. Cl.⁷ ................................................. H01L 21/82
(52) U.S. Cl. ..................... 438/132; 438/215; 438/281; 438/333
(58) Field of Search ............................ 438/132, 215, 438/281, 333, 407, 601, 633, 634, 637; 257/529

(56) References Cited

U.S. PATENT DOCUMENTS

| | | | |
|---|---|---|---|
| 4,329,706 | * 5/1982 | Crowder et al. | 257/755 |
| 4,873,506 | * 10/1989 | Gurevich | 257/529 |
| 5,169,802 | 12/1992 | Yeh et al. . | |
| 5,360,988 | * 11/1994 | Uda et al. | 257/529 |
| 5,420,455 | 5/1995 | Gilmour et al. . | |
| 5,523,253 | 6/1996 | Gilmour et al. . | |
| 5,663,590 | * 9/1997 | Kapoor | 257/529 |
| 5,960,254 | * 9/1999 | Cronin | 438/691 |

OTHER PUBLICATIONS

IBM Technical Disclsoure Bulletin, "Fuse Structure for Wide Fuse Materials Choice".

IBM Technical Disclsoure Bulletin, "Method to Incorporate Three Sets of Pattern Informaiton in Two PhotoMasking Steps".

* cited by examiner

*Primary Examiner*—Sara Crane
(74) *Attorney, Agent, or Firm*—Howard J. Walter, Jr.

(57) ABSTRACT

A structure and method of fabricating a metallization fuse line is disclosed. The structure can be formed on a semiconductor substrate, including an insulator structure formed on the substrate, the insulator structure having an upper layer and a lower layer, the upper being thinner than the lower, the insulator structure having a plurality of openings of varying depth, and a metal structure inlaid in the insulator structure, the metal structure having first and second portions and a third portion there between that is substantially more resistive than the first and second portions, the third portion having a thickness substantially similar to the thickness of the upper layer of the insulator structure. The upper layer includes a nitride, the lower layer includes an oxide and the metal structure includes copper. The fuse structure allows formation of "easy to laser delete" thin metal fuses within segments of thick metal lines. This applies to wiring layers formed from "high" melting temperature metals and those defined using a damascene process. For example, copper back end of line (Cu BEOL) damascene wiring, as used with CMOS can use the invention. The technique achieves high yield fusing for technologies that use thick wiring layers. The structure separates the thickness of the fuse segment from the remainder of the wiring line. The structure can be used with very thick, e.g., >1.2$\mu$ wiring and very thin, e.g., <0.5$\mu$ fuses.

8 Claims, 4 Drawing Sheets

PEDESTAL FUSE

BACKGROUND OF THE INVENTION

1. Field of the Invention

The present invention relates to semiconductor integrated circuit (IC) chips which can be tailored to include a fuse. The invention further relates to a method of making the improved circuit.

2. Related Art

Laser deletion of thick metal fuses is difficult due to the mass of metal that must be removed without damage to surrounding and underlying structures.

In the manufacture of semiconductor integrated circuits, wiring layers are deposited and defined and interconnected with conductive vias through a series of well known photolithography and metal etching steps. Each such wiring level is coated with a layer of a glassy protective material, known as a passivation layer, which protects and insulates the wiring of each layer. The creation of integrated circuits with such multiple wiring layers is well known to the semiconductor art.

In some circuits, such as CMOS logic circuits, the fuses designed in the circuit are often formed in regular arrays in the upper most layers of wiring and in a position such that other wiring is not placed immediately over or under the fuses. In such arrays the fuses are often aligned in parallel rows and placed as closely together as is possible. By opening selected ones of these fuses the logic elements of the circuits can be arranged in different combinations to perform different logic functions or correct manufacturing defects.

These fuses are typically opened by applying a laser pulse of sufficient size, duration and power as to superheat and vaporize the metal forming the fuse. This superheating of the fuse and its vaporization fractures and blows away a portion of the overlying glassy protective layer creating a saucer shaped crater in the protective layer. When the protective layer ruptures, cracks can radiate outwardly causing additional damage such as breakage of, or the uncovering of, adjacent fuse elements. Such uncovering of the adjacent elements can cause subsequent corrosion and premature failure of the circuit. While fuses are typically opened using a laser, they may also be opened by passage of electrical current or exposure to an ion beam which ablates (or removes or sputters) away the fuse link.

The reader is referred to the following patents related to fuses including "Array Protection Devices and Fabrication Method," U.S. Pat. No. 5,523,253, and "Array Fuse Damage Protection Devices and Fabrication Method," U.S. Pat. No. 5,420,455, both to Richard A. Gilmour, et al. and of common assignee to this invention, the contents of which are incorporated herein by reference in their entireties.

Fuses are used in semiconductor chips to provide redundancy, electrical chip identification and customization of function. For designs having three (or more) layers of wiring, the fuses are typically formed from a segment of one of the wiring layers, e.g., the "last metal" (LM) or "last metal minus one" (LM–1) wiring layer. Fusing, i.e., the deletion of a segment of metal fuse line, is accomplished by exposing the segment of metal fuse line to a short, high intensity pulse of "light" from an infra-red (IR) laser. The metal line absorbs energy, melts and expands, and ruptures any overlain passivation. The molten metal then boils or vaporizes out of its oxide surroundings, disrupting line continuity and causing high electrical resistance. A "sensing" circuit is used to detect fuse segment resistance.

Laser deletion of thick metal fuses is difficult due to the mass of metal that must be removed without damage to surrounding structures. As the mass of the fuse link increases or the melting temperature of the fuse link metal increases, higher laser energies and longer (or multiple) laser pulses are required to accomplish deletion. Higher energies and longer pulses provide sufficient energy to adjacent and underlying structures, e.g., silicon under the fuse area, to cause severe damage to the interlayer dielectric (ILD) oxide and adjacent fuse wiring. What is needed is a way to eliminate the need to use high laser energies.

SUMMARY OF THE INVENTION

The present invention includes a method for forming a thin pedestal fuse segment in a thick last metal (LM) wiring line, including the steps of forming a last metal minus 1 (LM–1) wiring layer and an overlaying oxide inter layer dielectric (ILD) using conventional techniques, depositing a layer of nitride using conventional techniques, wherein a thickness of the nitride layer is an approximate thickness desired for the thin pedestal fuse segment, defining with a resist layer and mask the LM wiring line that will contain a fuse link, wherein the fuse link is not yet imaged, etching the nitride layer and the oxide ILD, forming a thick line trench, stripping the resist, applying a new layer of resist and opening an image, defining the fuse link overlapping adjacent ends of an interrupted LM trench, etching the nitride layer using an etchant, stripping the new layer of resist, applying another layer of resist and imaging and etching via contacts, wherein the via contacts will connect the LM to the LM–1 wiring layers, stripping the another layer of resist, filling the wiring trench with at least one metal, and polishing to remove unwanted and excess metal, forming a LM damascene fuse line having the thin pedestal fuse segment.

In one embodiment of the invention, the oxide layer includes silicon dioxide. In another, the nitride layer includes silicon nitride. In yet another embodiment, the deposition steps can include chemical vapor deposition (CVD) and physical vapor deposition (PVD) techniques.

In one embodiment of the invention, the etching step includes using an etchant that is relatively selective to the nitride. In another embodiment, if the nitride layer is thin, selectivity is not required.

In another embodiment of the invention, the wiring trench can be filled with copper.

In an embodiment of the invention, the polishing step can include using at least one of a chemical and a mechanical polishing technique.

In another embodiment of the invention, a method for forming a thin pedestal fuse segment in a last metal (LM) wiring line includes the steps of forming a last metal minus 1 (LM–1) wiring layer and an overlaying oxide inter layer dielectric (ILD) layer using conventional techniques, depositing a layer of nitride using conventional techniques, wherein a thickness of the nitride layer is an approximate thickness desired for the thin pedestal fuse segment, defining with a resist layer and mask the LM wiring line that will contain a fuse link, wherein the fuse link is not yet imaged, etching the nitride layer and the underlying oxide ILD, forming a thick wiring line trench, stripping the resist layer, applying a new layer of resist and opening an image over an interrupted segment etching selectively the oxide to form vias using an etch selective to the oxide, leaving exposed a nitride pedestal cap, etching selectively the nitride pedestal cap using an etch selective to the nitride, stripping the new layer of resist, filling the wiring line trench with at least one metal, and polishing to remove unwanted and excess metal, forming LM damascene fuse line having the thin pedestal fuse segment.

In an embodiment of the invention, the first etching step includes using an etchant that is relatively selective to the nitride.

In another embodiment, the second etching step includes using an etchant, wherein if the nitride layer is thin, selectivity is not required.

In yet another embodiment, the invention includes filling the wiring line trench with copper metal. In another embodiment, the polishing step includes using a chemical or a mechanical polishing technique.

In another embodiment of the invention, a metallization structure formed on a semiconductor substrate, includes an insulator structure formed on the substrate, the insulator structure having an upper layer and a lower layer, the upper layer being thinner than the lower layer, the insulator structure having a plurality of openings therein of varying depth, and a metal structure inlaid in the insulator structure, the metal structure having first and second portions and a third portion there between that is substantially more resistive than the first and second portions, the third portion having a thickness that is substantially similar to the thickness of the upper layer of the insulator structure. In an embodiment of the invention, the upper layer includes a nitride layer and the lower layer includes an oxide layer. In another embodiment of the invention, the metal structure includes copper.

An advantage of the present invention is that the claimed fuse structure allows formation of "easy to delete" thin metal fuses within segments of thick metal lines. The claimed structure is particularly applicable to wiring layers formed from "high" melting temperature metals and those defined using a damascene process.

The present invention provides an integrated path to achieve high yield fusing for technologies that use thick wiring layers or wiring layers comprised of high melting temperature metals. The structure of the present invention separates the thickness of the fuse segment from the remainder of the wiring line. The structure is compatible with thick (such as, e.g., $0.8\mu$), very thick (such as, e.g., greater than $1.2\mu$ wiring) and very thin (such as, e.g., less than $0.5\mu$ fuses). The present invention is particularly valuable for technologies using damascene to define wiring levels. One example of applicable technology is in development of central processing unit (CPU) chip sets for CMOS semiconductor integrated circuit chips.

Further features and advantages of the invention, as well as the structure and operation of various embodiments of the invention, are described in detail below with reference to the accompanying drawings.

BRIEF DESCRIPTION OF THE DRAWINGS

The foregoing and other features and advantages of the invention will be described with reference to the accompanying drawings. In the drawings, like reference numbers generally indicate identical, functionally similar, and/or structurally similar elements. Also in the figures, the left most digit of each reference number corresponds to the figure in which the reference number is first used.

DETAILED DESCRIPTION OF THE INVENTION

Figure 1:
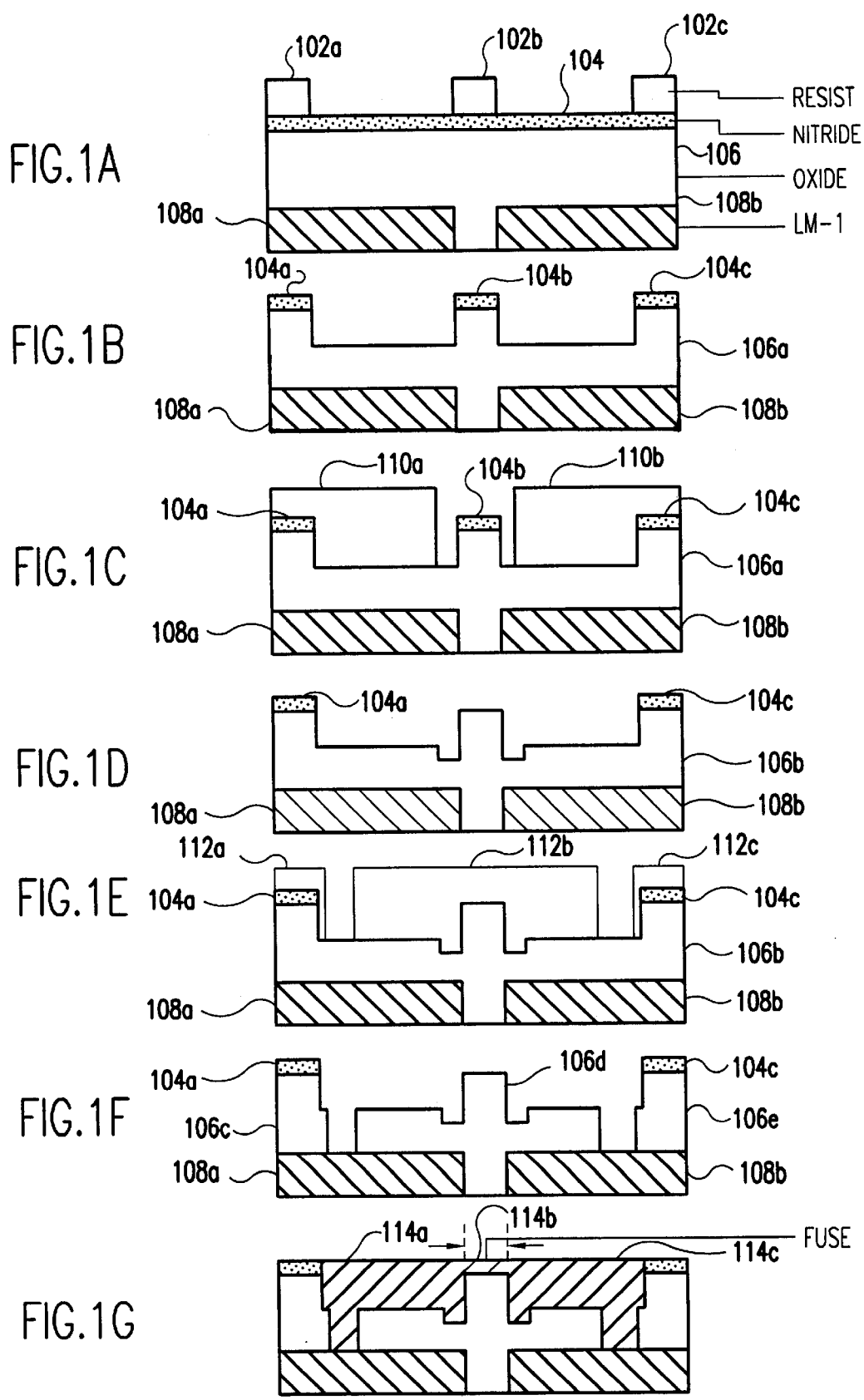
FIGS. 1A through 1G depict a cross-section of an integrated circuit during fabrication of the fuse of the present invention.

The preferred embodiment of the invention is discussed in detail below. While specific implementations are discussed, it should be understood that this is done for illustration purposes only. A person skilled in the relevant art will recognize that other components and configurations may be used without departing from the spirit and scope of the claimed invention.

Overview of Present Invention

Laser delete of metal fuses becomes more difficult as the thickness of the metal fuse increases. A section of last metal (LM) line is formed which is left intact in an unblown fuse and is removed in a blown fuse, in order to provide a high resistance. A fuse is blown by shining an infrared (IR) laser on the metal line. To make the line high resistance, all the metal of the fuse must be removed. This becomes difficult as the fuse gets thick, i.e., becomes deeper and deeper, requiring a higher energy IR laser. After sufficient depth, the metal line can not be removed without seriously damaging surrounding and underlaying structures. This invention provides a structure which creates a locally, thin, easy-to-delete line section and provides for the use of very thick wiring everywhere else on the circuit, chip or wafer. The present invention enables the use of very thick wiring to carry large amounts of current about the chip from one area to another, while still providing functional fuses, i.e. functional at low laser energies, such that no damage is sustained by surrounding circuitry.

Two exemplary fabrication sequences are described herein, both of which result in a thin fuse embedded in a thick wiring layer. The present invention advantageously permits the thickness of a fuse to be controlled, decoupled from the surrounding metallic wire line by varying the thickness of an upper nitride layer.

The invention includes a metal wiring line containing a fuse link segment where the fuse link segment is thinner than the adjacent fixed wiring line of which it is a part. The thickness of the fuse link segment can be adjusted independently of the remainder of the wiring line. Fuse link horizontal dimensions can be adjusted independently of the wiring line dimensions if desired. The present invention is particularly useful for back end of line (BEOL) wiring structures, where a "thick" wire option is employed.

It will be apparent to those skilled in the art, that the present invention is not restricted to LM or LM−1 wiring layers, but can be used at any wiring layer.

An example embodiment of the structure of the present invention can be formed using a technique including the following steps of:

1. forming an LM−1 wiring layer and its overlaying dielectric layer using conventional techniques;

2. depositing a layer of silicon nitride (i.e. referred to as the "nitride layer") using conventional techniques, such as, e.g., chemical vapor deposition (CVD), wherein the thickness of the silicon nitride layer is the approximate thickness desired for the "thin" fuse segment that will be formed in the last metal (LM) wiring line, e.g. less than or equal to $0.5\mu$;

3. defining the LM wiring line that will contain the fuse link, but not imaging the fuse link at this time;

4. etching the nitride and an underlying interlayer dielectric (ILD) (such as, e.g., silicon dioxide) (i.e. referred to as "the oxide layer") to form a thick line trench, typically of greater than or equal to (>=) 0.8$\mu$; stripping the resist;

5. applying a new layer of resist and opening an image to define the fuse link that overlaps adjacent ends of the interrupted LM trench;

6. etching the silicon nitride using an etchant that is relatively selective to the silicon nitride, wherein if the silicon nitride is thin, selectivity is not required; stripping the resist;

7. applying a new layer of resist and image and etching the via contacts that will connect LM to LM−1 wiring layers; stripping the new layer of resist; and 8. filling the wiring trench with the metal or metals of choice and chemically and/or mechanically polishing (stopping on the nitride), removing unwanted and/or excess metal. The preceding process is described further with respect to FIGS. 1A–1G and FIG. 2, below.

In an alternative embodiment, after defining the trench which will hold the conductor line (i.e., step 4 above), applying a new layer of resist (step 5) and opening images defining the vias and fuse link. Specifically, using an etch selective to oxide the technique first etches the vias, then using an etch selective to nitride the technique creates the shallow trench for the fuse link. The resist can then be stripped and the wiring trench can then be filled with one or more metals. The preceding alternative process is described further with reference to FIGS. 3A–F and 4.

Example Detailed Implementation of Specific Embodiments of the Present Invention FIGs. 1A through 1G depict a cross-section of an integrated circuit during fabrication of the fuse of the present invention. FIG. 2 depicts a flowchart 200 illustrating an example technique of fabricating the structure depicted in FIGS. 1A through 1G.

FIG. 2 begins with step 202 which can continue immediately with step 204. In step 204, an interrupted fuse line is formed including a resist layer, a nitride layer, an oxide layer and a last metal minus one (LM−1) layer. Specifically, interrupted fuse line is formed by placing a resist layer over the previously deposited nitride layer. The nitride layer can include a material such as, e.g., silicon nitride, deposited using conventional methods such as, e.g., chemical vapor deposition (CVD), over the previously deposited oxide layer. The oxide layer can include a material such as, e.g., silicon dioxide, deposited using a conventional method such as, e.g., chemical vapor deposition(CVD) on the previously deposited LM−1 layer. The thickness of the silicon nitride layer can be selected according to the approximate thickness desired for the resulting "thin" fuse segment (see FIG. 1G, below) which is to be formed in the last metal (LM) wiring line. In one embodiment, the desired thickness of the "thin" fuse segment can be, e.g., 0.5$\mu$ or less. In another embodiment, the desired fuse segment can be, e.g., 0.8$\mu$ or less. In yet another embodiment, the desired fuse segment can be, e.g., 0.3$\mu$ or less. Fuse thicknesses can be adjusted to provide advantageous chip yields. Table 1, below, illustrates exemplary fuse thicknesses and some observed fuse yields associated with certain example fuse segment thicknesses. An example of the structure formed by step 204 is depicted in FIG. 1A.

TABLE 1

| Fuse Structure | Fuse Material | Metal Thickness of fuse | Fusing Parameter | Fuse Yield |
| --- | --- | --- | --- | --- |
| Thick LM | Copper | 1.2$\mu$ | Single Pass | 71.9% |
| Thin LM | Copper | 0.5$\mu$ | Single Pass | 99.9% |

Figure 2:
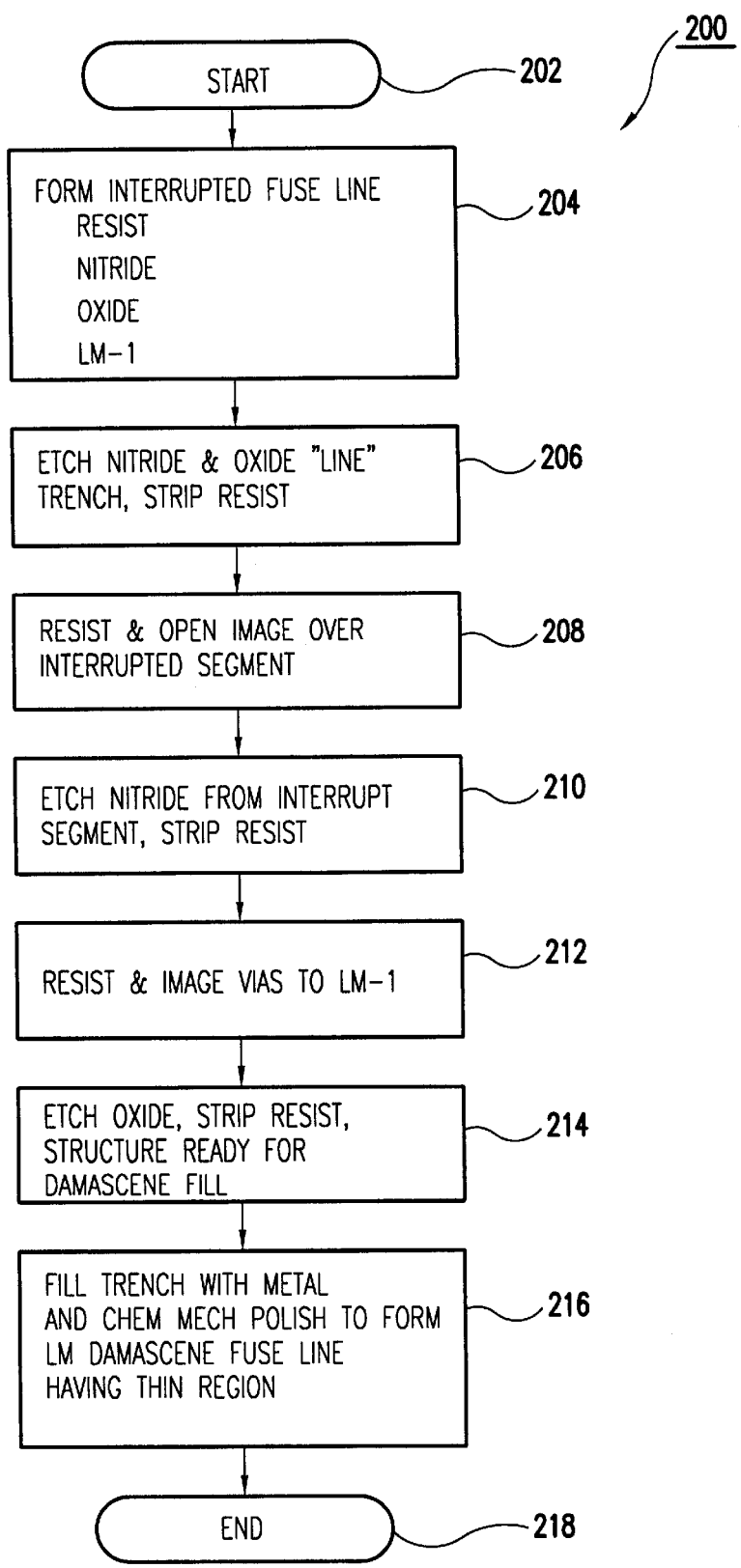
FIG. 2 depicts a flow diagram of the steps of an example process of this invention.

FIG. 1A illustrates a semiconductor structure including resist segments 102a, 102b and 102c formed on a thin upper nitride layer 104 which overlays an inter layer dielectric (ILD) oxide layer 106 which in turn overlays last metal minus 1 (LM−1) layer segments 108a and 108b.

From step 204, flowchart 200 can continue with step 206. In step 206, the nitride layer and oxide layer can be etched to create a "line" trench, and the resist layer can be stripped. The structure formed by step 206 is depicted in FIG. 1B.

FIG. 1B illustrates the semiconductor structure of FIG. 1A following etching of the nitride and oxide layers 104 and 106, yielding oxide layer 106a including exemplary line trenches and pedestals. Nitride 104 is etched leaving nitride segments 104a, 104b and 104c remaining capping the pedestals of oxide layer 106a, formed by stripped resist segments 102a, 102b and 102c. LM−1 segments 108a and 108b remain overlaid by the oxide ILD layer 106a.

From step 206, flowchart 200 can continue with step 208. In step 208, resist can be applied and an image can be opened using a mask or reticle over resist segments and interrupted center pedestal oxide segment, leaving uncovered the interrupted center pedestal oxide segment and covering the other oxide pedestal portions where the nitride layer will be retained. The resulting structure of the material is illustrated in FIG. 1C.

FIG. 1C illustrates the semiconductor structure of FIG. 1B following application of resist segments 110a and 110b and opening an image mask over interrupted center oxide segment of oxide 106a having nitride segment cap 104b, leaving resist segments 110a and 110b, protecting nitride segment caps 104a and 104c, respectively. LM−1 segments 108a and 108b remain overlaid by the oxide ILD layer 106a.

Photoresist can be dispensed with a wafer structure stationary or rotating. A uniform resist thickness is preferred.

After resist coating is complete, the wafer can be transported to a softbake station which can bake by direct conduction at a specified temperature and time.

The resist film is sensitive to specific wavelengths of ultraviolet light (UV). The wafer/resist combination can be inserted into a mask aligner, which can contain optics, a UV light source, and the circuit layer image contained on a mask or reticle, which is to be transferred to the resist film.

A development step can form the mask image by selectively removing exposed (or unexposed) regions in the positive (or negative) photoresist film. Wafers can be cassette loaded onto a developer/hardbake track and can be sent to a developer station. Developer solution can be dispensed to flood the wafer, and the wafer can remain idle while development proceeds for a time, and then a spin/rinse cycle or cycles can complete the process. An alternate technique can employ a temperature controlled bath where wafers are batch developed using agitation.

From step 208, flowchart 200 can continue with step 210. In step 210, the center nitride cap segment over center interrupt pedestal can be selectively etched away and the resist layer can then be stripped away. The center nitride cap segment, if sufficiently thin, can be etched without a selective etchant. It will be apparent to those skilled in the art that part of the oxide layer adjacent to the center pedestal can be removed during this etching process, if not covered by resist segments 110a and 110b, as shown in FIG. 1D. The resulting structure formed by step 210 is illustrated in FIG. 1D.

The patterned photoresist can expose the underlying material to be etched. The photoresist can be robust enough to withstand wet (acidic) and dry (plasma or reactive ion etching (RIE)) etching environments with good adhesion and image continuity, as well as the force of an implanter beam when used as an implantation mask.

Resist stripping can include complete removal of the photoresist after the masking process to prevent contamination in subsequent processes. There are many photoresist solvent (premixed) strippers available that will remove positive and negative photoresist (+PR and −PR) without adversely affecting the underlying material. A temperature controlled bath can be used for batch stripping of photoresist followed by appropriate rinsing. Ozone plasma($O_3$) can also be effective in removing photoresist.

FIG. 1D illustrates the semiconductor structure of FIG. 1C following etching of interrupted nitride cap segment 104b of oxide 106a, and stripping of resist segments 110a and 110b, leaving exposed the center pedestal portion of oxide 106b and nitride caps 104a and 104c. LM−1 segments 108a and 108b remain overlaid by the oxide ILD layer 106b.

From step 210, flowchart 200 can continue with step 212. In step 212, resist can be applied and an image can be opened using a mask for defining vias to the LM−1 layer forming resist segments leaving uncovered the intended locations of the vias and covering the center pedestal portion of the oxide and the two nitride capped pedestals. The resulting structure formed by step 212 is illustrated in FIG. 1E.

FIG. 1E illustrates the semiconductor structure of FIG. 1D following application of resist segments 112a, 112b and 112c over pedestals portions of oxide 106b including nitride cap segments 104a and 104c and opening an image mask so as to leave uncovered by resist portions of oxide 106a intended as locations of vias to LM−1 segments 108a and 108b. LM−1 segments 108a and 108b remain overlaid by the oxide ILD layer 106b.

From step 212, flowchart 200 can continue with step 214. In step 214, the oxide segments intended as locations of vias to LM−1 can be selectively etched away and the resist segments can then be stripped away, leaving a structure include vias and line trenches ready for a damascene metallization fill. Various etching techniques can be used including, e.g., wet etching and dry etching. Wet etching can use various mixtures of hydrofluoric acid and water (e.g., 10:1, 6:1, 100:1), and can include a buffering agent such as ammonium fluoride for a slower, more controlled etch rate. Although relatively inexpensive, wet etching can also lead to severe undercutting since it is an isotropic process, i.e. proceeding at nearly equal rates in all directions, which can make it impractical. To avoid encroachment, dry, or plasma etch technology, using, e.g., a glow discharge to ionize an inert gas (i.e. reactive ion etching (RIE)physical sputtering) can be used to set up very anisotropically (i.e. directional) etched features, providing for higher circuit densities. When multiple layers are involved in dry etching process, such as silicon nitride over silicon dioxide, it is important to know the relative etch rates of the two materials in the available etchants. This "selectivity" will determine if significant etching of underlying layers will occur. Plasma etch processes, since they are basically chemical by nature exhibit better selectivity as compared to RIE physical sputtering processes. To etch the oxide layer using plasma etch $CF_4$, $CHF_3$ and $NF_3$ gases can be used, for example, with an etch rate of greater than 5000 angstrom per minute. The resulting structure formed by step 214 is illustrated in FIG. 1F.

FIG. 1F illustrates the semiconductor structure of FIG. 1E following etching of oxide 106b to form vias therein. FIG. 1F depicts oxide 106b with etched vias yielding oxide portions 106c, 106d and 106e. Oxide portions 106c and 106e have nitride segments 104a and 104c capping them, respectively. And center pedestal 106d is now ready for damascene fill to form a thin line fuse of thickness approximately equal to original nitride segment 104b. The vias formed by etching in step 214 of oxide 106b provide access to LM−1 segments 108a and 108b as shown.

From step 214, flowchart 200 can continue with step 216. In step 216, the trench formed by the preceding steps can be filled with one or more layers of metal or barrier layers followed by metal and can be polished using a chemical, mechanical polishing process to form a last metal (LM) damascene fuse line link having a thin region of thickness approximately equal to the nitride layer thickness. Metal is used in semiconductor processing for creating low resistance paths. Barrier layers are used to prevent metal interaction with the surrounding dielectric. Metal and barrier layers can be put down by, e.g., the chemical vapor deposition(CVD) process, physical vapor deposition (PVD) sputtering process, evaporation, and plating. For example, using CVD, $WF_6$ can be used to deposit tungsten (W). Copper can be deposited using a sputtering process or plating. Physical vapor deposition can be done by an evaporation metallization process and a sputtering deposition process. Copper deposition can include depositing Ta or TaN as a liner or barrier layer between Cu and Si. The resulting structure formed by step 216 is illustrated in FIG. 1G. From step 216, flowchart can immediately end with step 218.

FIG. 1G illustrates the semiconductor structure of FIG. 1E following filling of the trench formed in FIGS. 1A–1F with metal forming thin fuse link segment 114b, and thick wire lines 114a and 114c, adjacent to segment 114b. Following filling of the metal by damascene process, the top surface of the structure can be polished. Chemical mechanical polishing can be used to form the last metal (LM) damascene fuse line 114 having thin region 114b. Polishing is the process of grinding flat, microsanding and/or planarizing the resulting surface to obtain a structure of uniform thickness. Polishing can include chemically removing variations left after grinding including chemical etching using acid formulations, and can include a chemical/mechanical process to produce a polished, highly reflective, damage free surface. The damascene process includes the process of filling in with metal and polishing the resulting surface of the structure. Resulting thin fuse link segment 114b is approximately the same thickness as nitride cap segment 104b of FIG. 1B.

FIGS. 3A through 3F depict a cross-section of an integrated circuit during an alternative fabrication technique embodiment of the fuse of the present invention. FIG. 4 depicts a flowchart 400 illustrating an example technique of fabricating the structure depicted in FIGS. 3A through 3F.

FIG. 4 begins with step 402 which can continue immediately with step 404. In step 404, an interrupted fuse line is formed including a resist layer, a nitride layer, an oxide layer and a last metal minus one (LM−1) layer. Specifically, interrupted fuse line is formed by placing a resist layer over the previously deposited nitride layer. The nitride layer can include a material such as, e.g., silicon nitride, deposited using conventional methods such as, e.g., chemical vapor deposition (CVD), over the previously deposited oxide layer. The oxide layer can include a material such as, e.g., silicon dioxide, deposited using a conventional method such as, e.g., chemical vapor deposition(CVD) on the previously deposited LM-1 layer. The thickness of the silicon nitride layer can be selected according to the approximate thickness desired for the resulting "thin" fuse segment (see FIG. 3F, below) which is to be formed in the last metal (LM) wiring line. In one embodiment, the desired thickness of the "thin" fuse segment can be, e.g., $0.5\mu$ or less. In another embodiment, the desired fuse segment can be, e.g., $0.8\mu$ or less. In yet another embodiment, the desired fuse segment can be, e.g., $0.3\mu$ or less. Certain thicknesses can provide advantageous chip yields. Table 1, above, illustrates exemplary fuse thicknesses and some observed fuse yields associated with certain example fuse segment thicknesses. An example of the structure formed by step 404 is depicted in FIG. 3A.

Figure 3A:
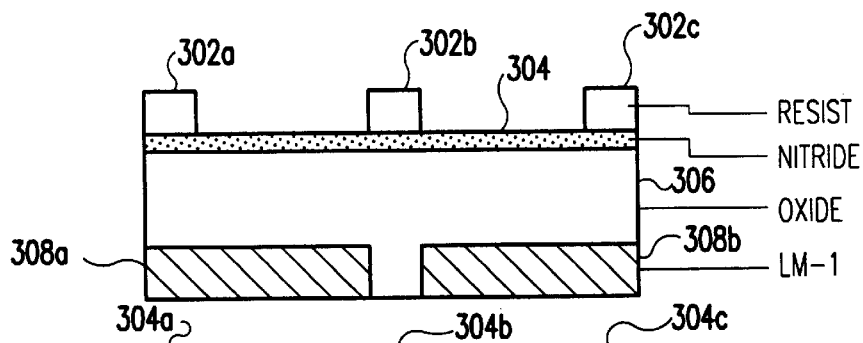
FIGS. 3A through 3F depict a cross-section of an integrated circuit during an alternative fabrication technique embodiment of the fuse of the present invention.
Figure 4:
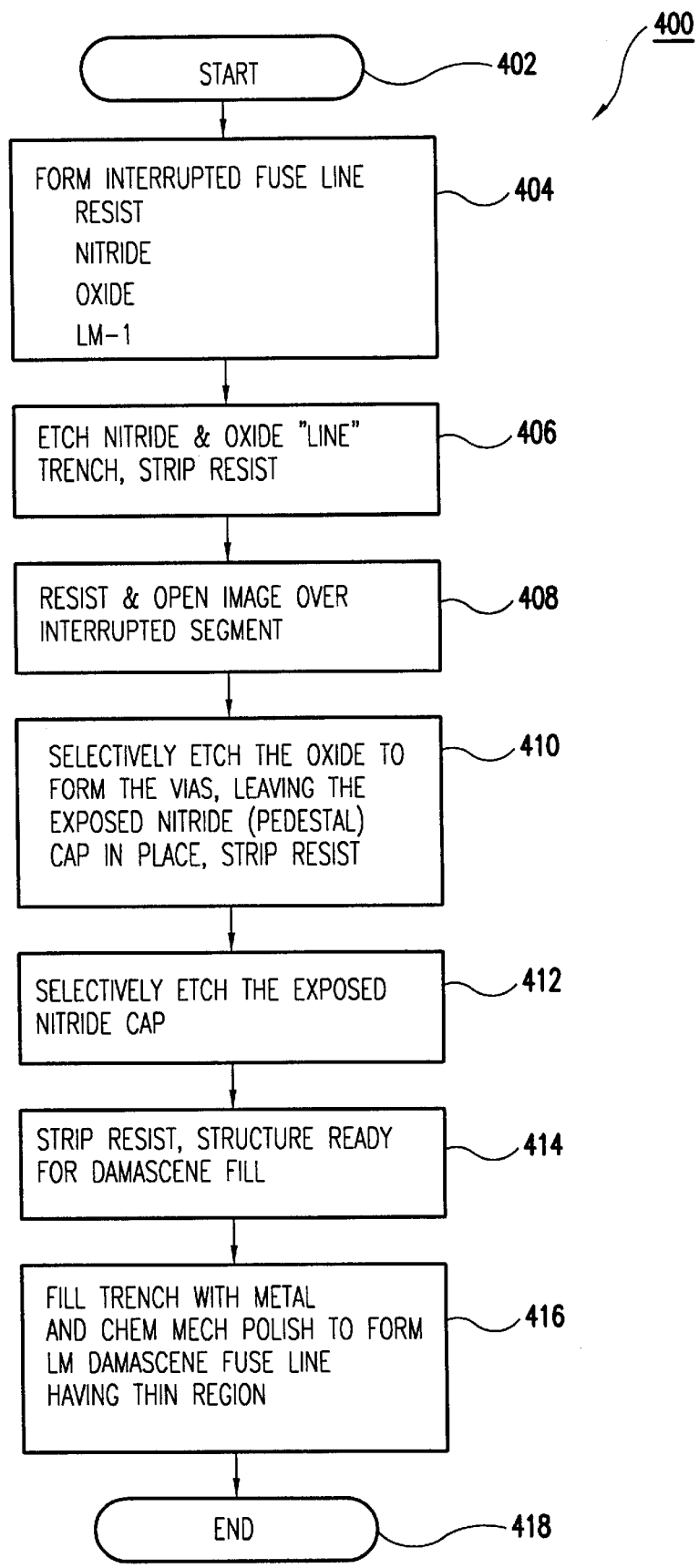
FIG. 4 depicts a flowchart illustrating an example technique of fabricating the structure of the present invention.

FIG. 3A illustrates a semiconductor structure including resist segments 302a, 302b and 302c formed on a thin upper nitride layer 304 which overlays an inter layer dielectric (ILD) oxide layer 306 which in turn overlays last metal minus 1 (LM-1) layer segments 308a and 308b.

From step 404, flowchart 400 can continue with step 406. In step 406, the nitride layer and oxide layer can be etched to create a "line" trench, and the resist layer can be stripped. The structure formed by step 406 is depicted in FIG. 3B.

Figure 3B:

FIG. 3B illustrates the semiconductor structure of FIG. 3A following etching of the nitride and oxide layers 304 and 306, yielding oxide layer 306a including exemplary line trenches and pedestals. Nitride 304 is etched leaving nitride segments 304a, 304b and 304c remaining capping the pedestals of oxide layer 306a, formed by stripped resist segments 302a, 302b and 302c. LM-1 segments 308a and 308b remain overlaid by the oxide ILD layer 306a.

From step 406, flowchart 400 can continue with step 408. In step 408, resist can be applied and an image can be opened using a mask or reticle over resist segments and interrupted center pedestal oxide segment, leaving uncovered the interrupted center pedestal oxide segment and covering the other oxide pedestal portions where the nitride layer will be retained. The resulting structure of the material is illustrated in FIG. 3C.

Figure 3C:
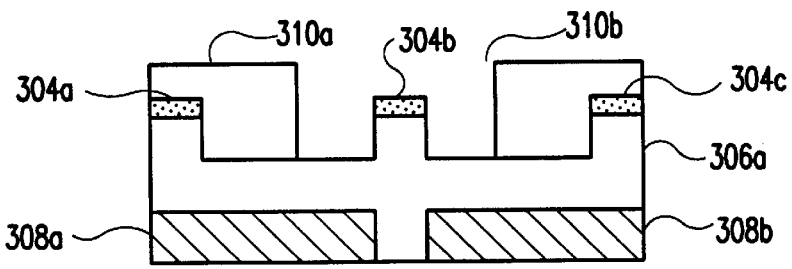

FIG. 3C illustrates the semiconductor structure of FIG. 3B following application of resist segments 310a and 310b and opening an image mask over interrupted center oxide segment of oxide 306a having nitride segment cap 304b, leaving resist segments 310a and 310b, protecting nitride segment caps 304a and 304c, respectively. LM-1 segments 308a and 308b remain overlaid by the oxide ILD layer 306a.

From step 408, flowchart 400 can continue with step 410. In step 410, the technique can selectively etch the exposed oxide layer forming vias to the LM-1 layer, leaving exposed the nitride cap segment protecting the center pedestal oxide segment, and leaving covered the two other pedestal portions of the oxide and their two nitride caps. The resulting structure formed by step 410 is illustrated in FIG. 3D.

Figure 3D:
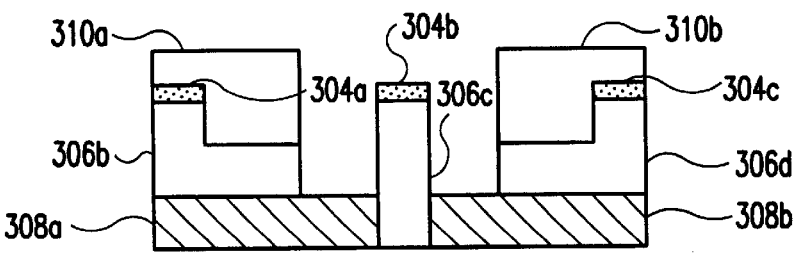

FIG. 3D illustrates the semiconductor structure of FIG. 3C following selective etching of oxide 306a forming vias to LM-1 segments 308a and 308b. Resist segments 310a and 310b protect pedestal portions of oxide 306b and 306d and nitride cap segments 304a and 304c, and LM-1 segments 308a and 308b are overlaid by the oxide ILD layer segments 306b and 306d.

Figure 3E:
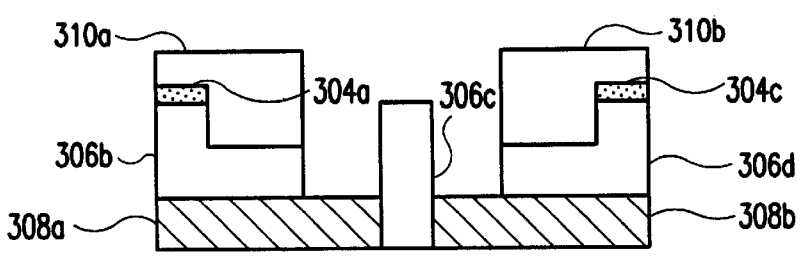

From step 410, flowchart 400 can continue with step 412. In step 412, the center nitride cap segment over the center interrupt oxide pedestal can be selectively etched away and the resist layer can then be stripped away. The center nitride cap segment, if sufficiently thin, can be etched without a selective etchant. It will be apparent to those skilled in the art that the oxide layer segments 306b and 306d could be etched if not covered by resist segments 310a and 310b, as shown in FIG. 3E. The resulting structure formed by step 412 is illustrated in FIG. 3E.

FIG. 3E illustrates the semiconductor structure of FIG. 3D following etching of interrupted nitride cap segment 304b of center pedestal oxide 306c. LM-1 segments 308a and 308b remain overlaid by the oxide ILD layer segments 306b and 306c.

From step 412, flowchart 400 can continue with step 414. In step 414, the resist is stripped away, including resist segments 310a and 310b, leaving the structure ready for damascene fill. The resulting structure includes vias and line trenches ready for a damascene metallization fill. The resulting structure formed by step 414 after damascene filling is illustrated in FIG. 3F.

From step 414, flowchart 400 can continue with step 416. In step 416, the trench formed by the preceding steps can be filled with metal and can be polished using a chemical, mechanical polishing process to form a last metal (LM) damascene fuse line link having a thin region of thickness approximately equal to the nitride layer thickness. The resulting structure formed by step 416 is illustrated in FIG. 3F. From step 416, flowchart can immediately end with step 418.

Figure 3F:
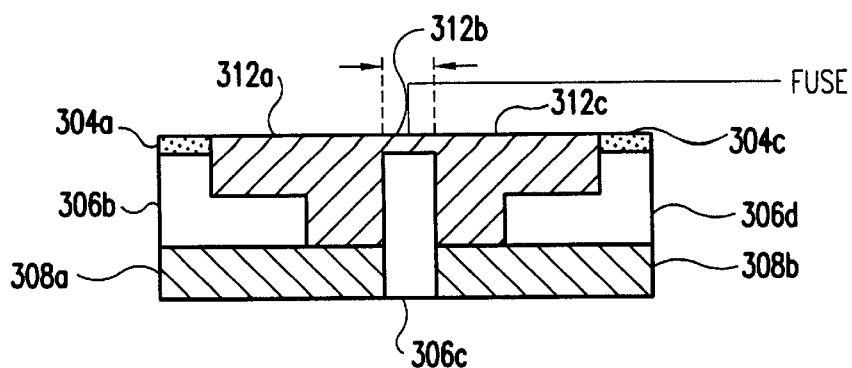

FIG. 3F illustrates the semiconductor structure of FIG. 3E following filling of the trench formed in FIGS. 3A–3E with metal forming thin fuse link segment 312b capping pedestal oxide portion 306c, and thick wire lines 312a and 312c, adjacent to segment 312b. Following filling of the trenches with the metal by damascene process, the top surface of the structure can be polished. Chemical mechanical polishing can be used to form the last metal (LM) damascene fuse line 312 having thin region 312b. Resulting thin fuse link segment 312b is approximately the same thickness as nitride cap segment 304b of FIG. 3B.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for forming a thin pedestal fuse segment in a thick last metal (LM) wiring line, comprising the steps of:

(a) forming a last metal minus 1 (LM-1) wiring layer and an overlaying oxide inter layer dielectric (ILD) using conventional techniques;

(b) depositing a layer of nitride using conventional techniques, wherein a thickness of said nitride layer is an approximate thickness desired for the thin pedestal fuse segment;

(c) defining with a resist layer and mask the LM wiring line that will contain a fuse link, wherein said fuse link is not yet imaged;

(d) etching said nitride layer and said oxide ILD, forming a thick line trench;

(e) stripping said resist;

(f) applying a new layer of resist and opening an image, defining said fuse link overlapping adjacent ends of an interrupted LM trench;

(g) etching said nitride layer using an etchant;

(h) stripping said new layer of resist;

(i) applying another layer of resist and imaging and etching via contacts, wherein said via contacts will connect said LM to said LM−1 wiring layers;

(j) stripping said another layer of resist;

(k) filling said wiring trench with at least one metal; and (l) polishing to remove unwanted and excess metal, forming LM damascene fuse line having the thin pedestal fuse segment.

2. The method according to claim 1, wherein said oxide layer comprises silicon dioxide.

3. The method according to claim 1, wherein said nitride comprises silicon nitride.

4. The method according to claim 1, wherein said step (b) comprises at least one of a chemical vapor deposition (CVD), a physical vapor deposition (PVD), an evaporation, and a plating technique.

5. The method according to claim 1, wherein said step (g) comprises using an etchant that is relatively selective to said nitride.

6. The method according to claim 1, wherein said step (g) comprises using an etchant, wherein if said nitride layer is thin, selectivity is not required.

7. The method according to claim 1, wherein said step (k) comprises filling said wiring trench with copper.

8. The method according to claim 1, wherein said step (l) comprises using at least one of a chemical and a mechanical polishing technique.

* * * * *